United States Patent
You

(10) Patent No.: US 8,138,049 B2
(45) Date of Patent: Mar. 20, 2012

(54) FABRICATION OF LATERAL DOUBLE-DIFFUSED METAL OXIDE SEMICONDUCTOR (LDMOS) DEVICES

(75) Inventor: Budong You, Fremont, CA (US)

(73) Assignee: Silergy Technology, Sunnyvale, CA (US)

( * ) Notice: Subject to any disclaimer, the term of this patent is extended or adjusted under 35 U.S.C. 154(b) by 226 days.

(21) Appl. No.: 12/455,223

(22) Filed: May 29, 2009

(65) Prior Publication Data
US 2010/0301413 A1 Dec. 2, 2010

(51) Int. Cl.
*H01L 29/78* (2006.01)
(52) U.S. Cl. .................. 438/286; 257/E29.261
(58) Field of Classification Search .......... 438/286, 438/291, 294, 297, 306, 307; 257/E21.417, 257/E29.261
See application file for complete search history.

(56) References Cited

U.S. PATENT DOCUMENTS

| 7,405,117 B2 | 7/2008 | Zuniga et al. |
| 2001/0035553 A1 | 11/2001 | Kikuchi |
| 2006/0033155 A1* | 2/2006 | Wu et al. ............... 257/335 |
| 2007/0075363 A1* | 4/2007 | Otake et al. ............ 257/335 |
| 2007/0114607 A1* | 5/2007 | Pendharkar ............ 257/343 |
| 2007/0207600 A1 | 9/2007 | You et al. |

FOREIGN PATENT DOCUMENTS
CN 1956217 A 5/2007
* cited by examiner

*Primary Examiner* — Evan Pert
*Assistant Examiner* — Selim Ahmed
(74) *Attorney, Agent, or Firm* — Michael C. Stephens, Jr.

(57) ABSTRACT

Methods of making, structures, devices, and/or applications for lateral double-diffused metal oxide semiconductor (LDMOS) transistors are disclosed. In one embodiment, a method of fabricating an LDMOS transistor with source, drain, and gate regions on a substrate, can include: forming p-type and n-type buried layer (PBL, NBL) regions; growing an epitaxial (N-EPI) layer on the NBL/PBL regions; forming a p-doped deep p-well (DPW) region on the PBL region; forming a well region in the N-EPI layer; forming a doped body region; after the doped body region formation, forming an active area and a field oxide (FOX) region, and forming a drain oxide between the source and drain regions of the LDMOS transistor; after the doped body region formation, forming a gate oxide adjacent to the source and drain regions, and forming a gate on the gate oxide and a portion of the drain oxide; and forming a doped drain region, and first and second doped source regions.

20 Claims, 14 Drawing Sheets

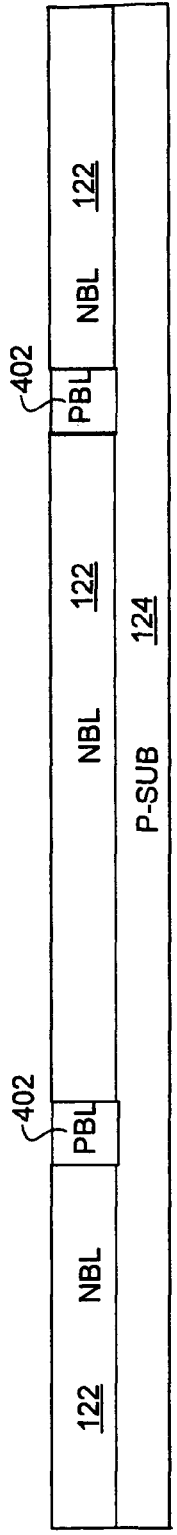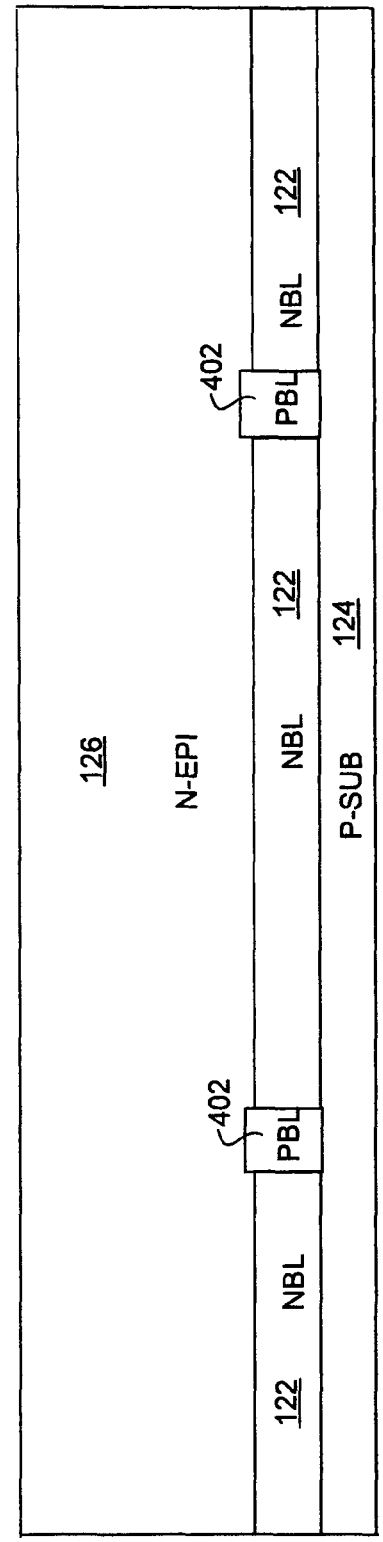
FIG. 4A
FIG. 4B

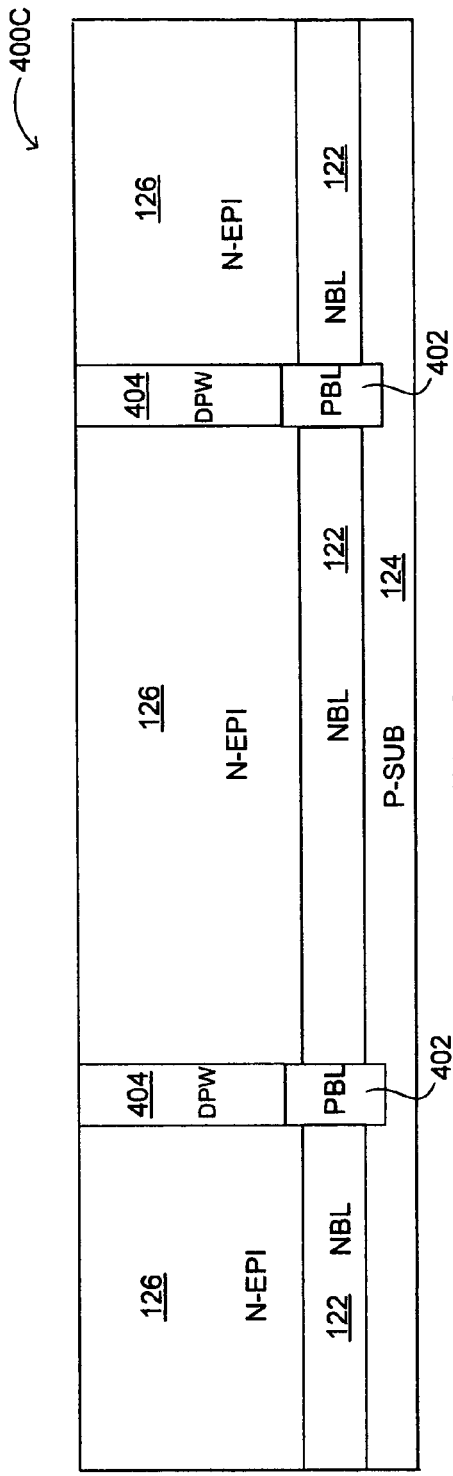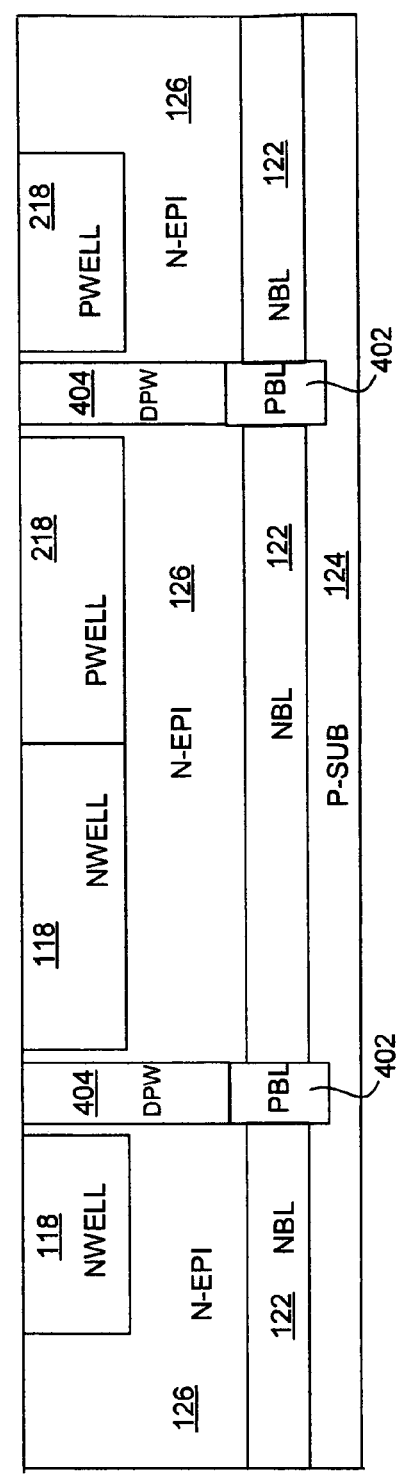
FIG. 4C
FIG. 4D

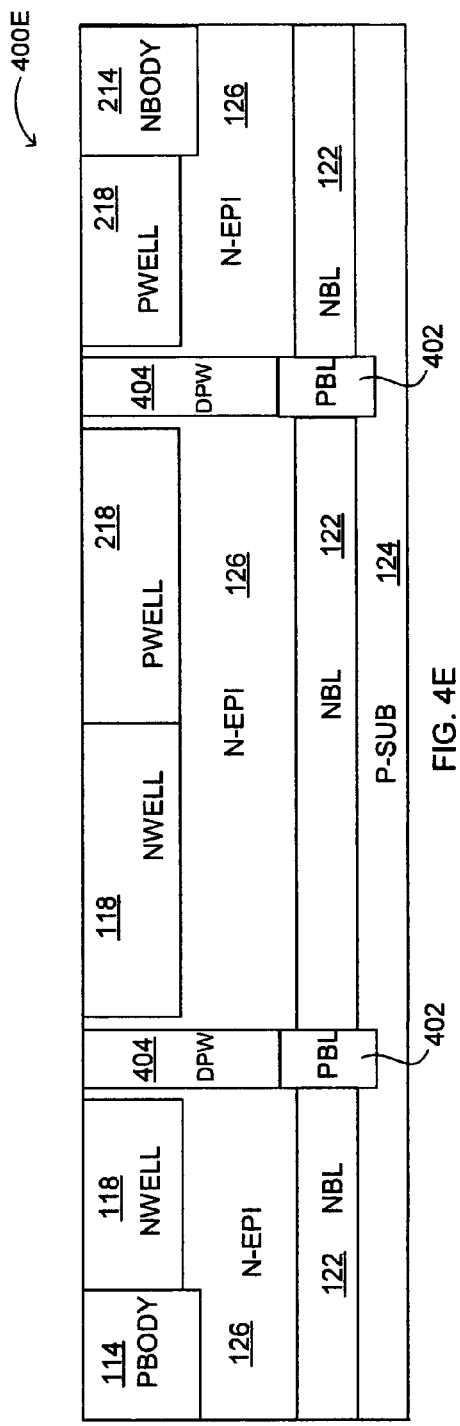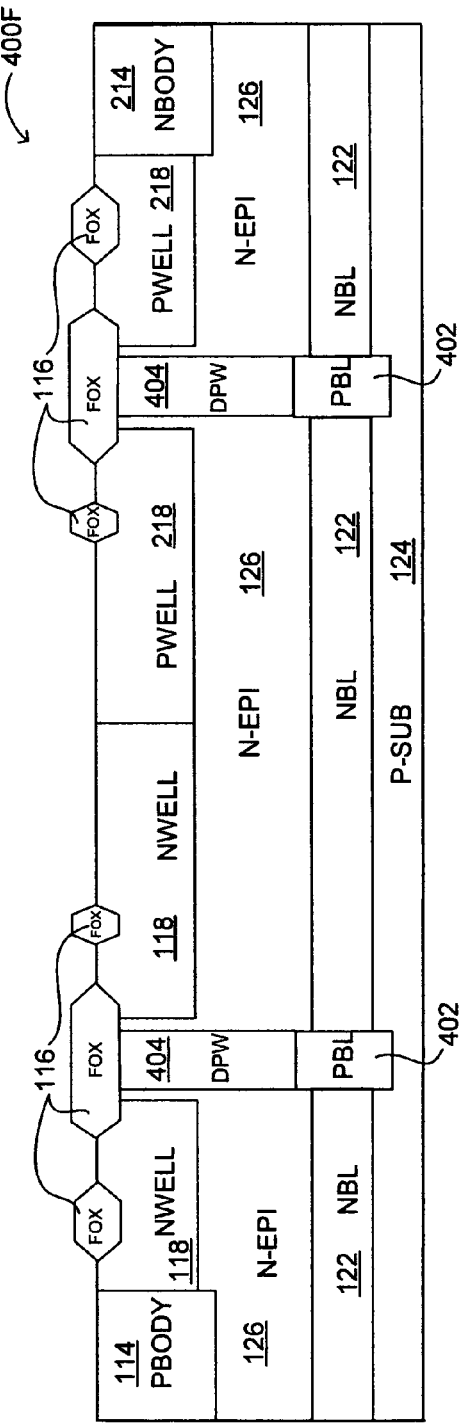
FIG. 4E
FIG. 4F

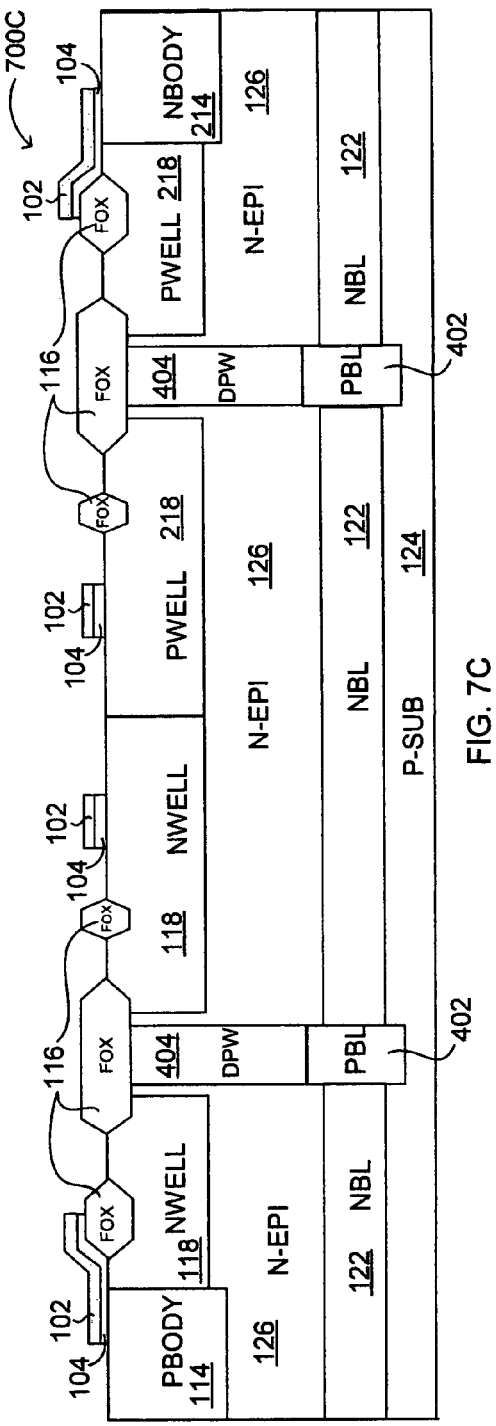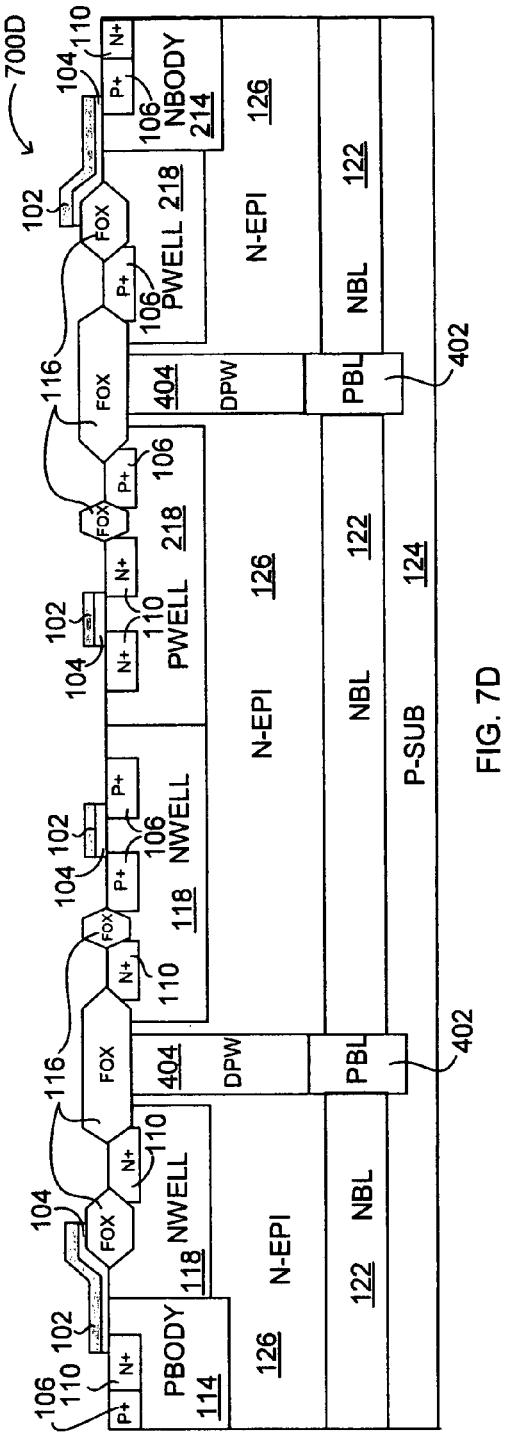
FIG. 7C
FIG. 7D

FABRICATION OF LATERAL DOUBLE-DIFFUSED METAL OXIDE SEMICONDUCTOR (LDMOS) DEVICES

FIELD OF THE INVENTION

The present invention generally relates to the field of semiconductor devices. More specifically, embodiments of the present invention pertain to lateral double-diffused metal oxide semiconductor (LDMOS) transistors.

BACKGROUND

Voltage regulators, such as DC-to-DC voltage converters, are used to provide stable voltage sources for various electronic systems. Efficient DC-to-DC converters are particularly needed for battery management in low power devices (e.g., laptop notebooks, cellular phones, etc.). A switching voltage regulator generates an output voltage by converting an input DC voltage into a high frequency voltage, and then filtering the high frequency input voltage to generate the output DC voltage. Specifically, the switching regulator includes a switch for alternately coupling and decoupling an input DC voltage source (e.g., a battery) to a load (e.g., an integrated circuit (IC)). An output filter, typically including an inductor and a capacitor, may be coupled between the input voltage source and the load to filter the output of the switch, and thus provide the output DC voltage. A controller (e.g., a pulse width modulator, a pulse frequency modulator, etc.) can control the switch to maintain a substantially constant output DC voltage.

Lateral double-diffused metal oxide semiconductor (LDMOS) transistors are commonly used as a power switch in switching regulators due to their performance in terms of a tradeoff between their specific on-resistance ($R_{dson}$) and drain-to-source breakdown voltage ($BV_{ds}$), while CMOS transistors are widely used for controller and driver design. Semiconductor manufacturing processes that integrate both LDMOS transistors and CMOS transistors on a same piece of silicon, such as in a Bipolar-CMOS-DMOS (BCD) process, enables monolithic integration of switching regulators, including power switches, drivers and controllers, resulting in higher performance.

Drain and body region formation and optimization are key process steps used in making LDMOS transistors. In conventional approaches to fabricating LDMOS transistors, either the drain and body regions do not share process steps with CMOS transistors, thus increasing an overall number of BCD process steps and associated manufacturing cost, or the optimization of the drain and body regions includes a thermal cycle that can interrupt an existing CMOS process flow, thus increasing the BCD process integration complexity.

SUMMARY

Embodiments of the present invention relate to methods of making, structures, devices, and/or applications for lateral double-diffused metal oxide semiconductor (LDMOS) transistors.

In one embodiment, a method of fabricating an LDMOS transistor with a source region, a drain region, and a gate region on a substrate, can include: (i) implanting p-type dopants into a surface of the substrate to form a p-type buried layer (PBL) region, and implanting n-type dopants into the surface of the substrate to form an n-type buried layer (NBL) region, the NBL region and the PBL region being adjacent to each other, or having a spacing; (ii) growing an n-type epitaxial (N-EPI) layer on the NBL and PBL regions; (iii) implanting p-type dopants into the surface of the substrate to form a p-doped deep p-well (DPW) region on the PBL region; (iv) forming a well region in the N-EPI layer; (v) implanting dopants into the source region to form a doped body region; (vi) after the doped body region formation, forming an active area and a field oxide (FOX) region for isolation of the LDMOS transistor, and forming a drain oxide between the source region and the drain region of the LDMOS transistor; (vii) after the doped body region formation, forming a gate oxide adjacent to the source and drain regions, and forming a gate by covering the gate oxide and a portion of the drain oxide with a conductive material; and (viii) implanting dopants into the drain and source regions to form a doped drain region, and first and second doped source regions.

In another embodiment, a method of fabricating an LDMOS transistor with a source region, a drain region, and a gate region on a substrate, can include: (i) implanting p-type dopants into a surface of the substrate to form a PBL region, and implanting n-type dopants into the surface of the substrate to form an NBL region, the NBL region and the PBL region being adjacent to each other, or having a spacing; (ii) growing an N-EPI layer on the NBL and PBL regions; (iii) implanting p-type dopants into the surface of the substrate to form a DPW region on the PBL region; (iv) forming a well region in the N-EPI layer; (v) forming an active area and a FOX region for isolation of the LDMOS transistor, and forming a drain oxide between the source region and the drain region of the LDMOS transistor; (vi) forming a gate oxide adjacent to the source and drain regions, and forming a gate by covering the gate oxide and a portion of the drain oxide with a conductive material; (vii) after the FOX, the active area, and the gate oxide formation, implanting dopants into the source region to form a doped body region; and (viii) implanting dopants into the drain and source regions to form a doped drain region, and first and second doped source regions.

In another embodiment, an LDMOS transistor having a source region, a drain region, and a gate region on a substrate, can include: (i) a PBL region and an NBL region adjacent to each other on a substrate, or having a spacing; (ii) an N-EPI layer on the NBL and PBL regions; (iii) a DPW region on the PBL region; (iv) a well region in the N-EPI layer; (v) a FOX region for isolation of the LDMOS transistor; (vi) a drain oxide between the source region and the drain region of the LDMOS transistor; (vii) a gate oxide adjacent to the source and drain regions; (viii) a conductive gate over the gate oxide and a portion of the drain oxide; (ix) a doped body region in the source region, where the doped body region partially overlaps with the well region; (x) a doped drain region in the drain region; and (xi) a first doped source region and a second doped source region adjacent to each other in the source region of the doped body region.

Embodiments of the present invention can advantageously provide an LDMOS transistor that facilitates integration with CMOS transistors. These and other advantages of the present invention will become readily apparent from the detailed description of preferred embodiments below.

BRIEF DESCRIPTION OF THE DRAWINGS

FIGS. 4A-4H are cross-section diagrams showing an example process flow for making a LDMOS transistor per the first example method of FIG. 3, in accordance with embodiments of the present invention.

FIGS. 7A-7D are cross-section diagrams showing an example process flow for making a LDMOS transistor per the second example method of FIG. 6, in accordance with embodiments of the present invention.

DETAILED DESCRIPTION

Figure 1:
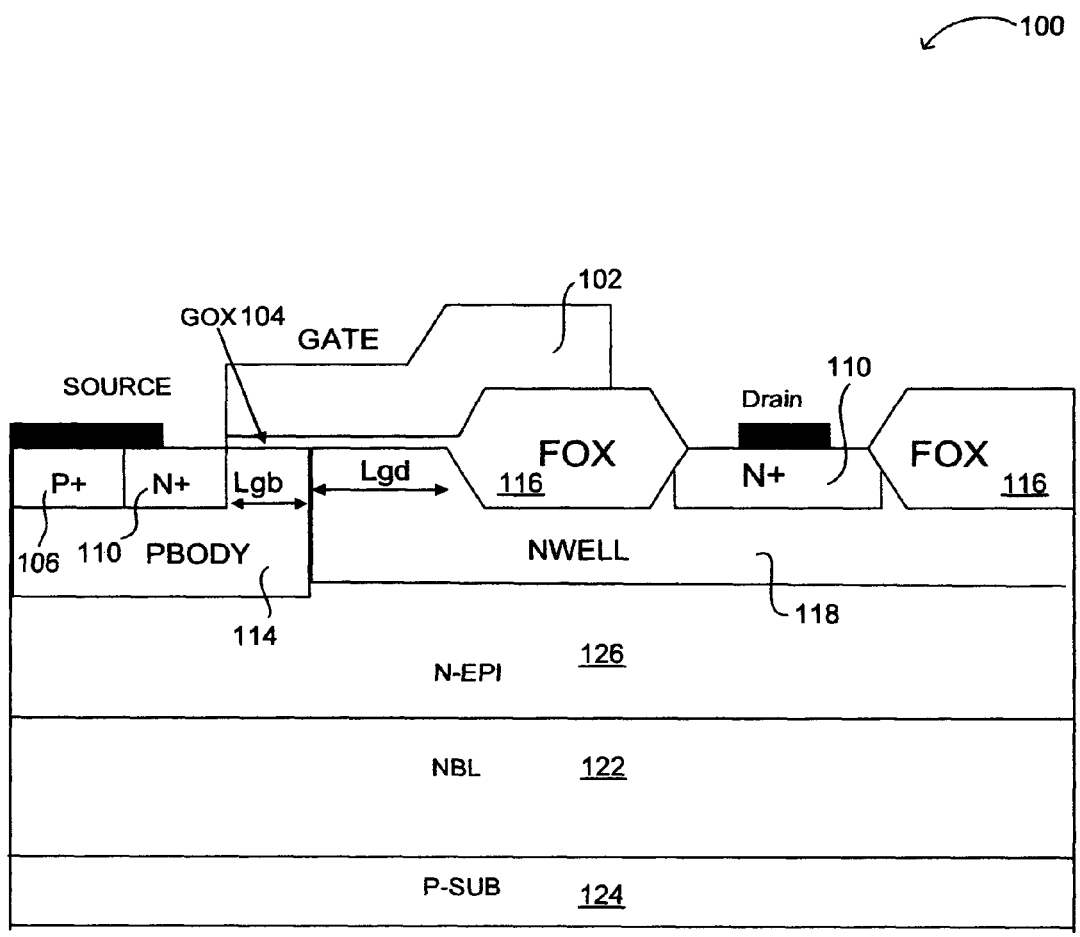
FIG. 1 is a cross-section diagram of an example n-type LDMOS transistor.

Reference will now be made in detail to particular embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, processes, components, structures, and circuits have not been described in detail so as not to unnecessarily obscure aspects of the present invention.

Some portions of the detailed descriptions which follow are presented in terms of processes, procedures, logic blocks, functional blocks, processing, schematic symbols, and/or other symbolic representations of operations on data streams, signals, or waveforms within a computer, processor, controller, device and/or memory. These descriptions and representations are generally used by those skilled in the data processing arts to effectively convey the substance of their work to others skilled in the art. Usually, though not necessarily, quantities being manipulated take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

Furthermore, in the context of this application, the terms "wire," "wiring," "line," "signal," "conductor," and "bus" refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

In certain embodiments, a lateral double-diffused metal oxide semiconductor (LDMOS) transistor using twin well (NWELL/PWELL) structures can be formed. For example, these well structures can also be employed for CMOS devices in order to simplify an overall process flow by reducing a number of process steps. In addition, doped body regions (e.g., p-doped p-body (PBODY) and n-doped n-body (NBODY)) can be fabricated either before or after formation of field oxide (FOX), active region, and gate oxide (GOX). When the PBODY and NBODY structures are fabricated before formation of FOX, these body structures may also be used as twin wells of CMOS devices.

The invention further relates to hardware implementations of the present structure, method and circuit. Embodiments of the present invention can advantageously provide: (i) sharing of wells (e.g., NWELL/PWELL or PBODY/NBODY) between LDMOS and CMOS structures and/or devices in order to simplify the fabrication process, and reduce overall manufacturing costs; (ii) formation of NWELL/PWELL or PBODY/NBODY before FOX/active formation to allow for optimization of NWELL/PWELL or PBODY/NBODY drive-in time, without affecting other process steps performed after such FOX/active formation, thus facilitating process integration; and (iii) an alternative formation of PBODY or NBODY to accommodate a self-aligned formation of PBODY and NBODY regions with respect to a polysilicon gate, thus providing improved control of device channel length. The invention, in its various aspects, will be explained in greater detail below with regard to exemplary embodiments.

Referring now to FIG. 1, shown is a cross-section diagram 100 of an example n-type LDMOS (N-LDMOS) transistor. In this example, the drain region of the N-LDMOS can be formed using NWELL 118, which may also be a well of a PMOS transistor. Highly doped n-type n+ region 110 can be formed within NWELL 118, and an n-type ohmic contact from n+ region 110 can be made to the drain electrode (e.g., metal) for connection to other circuitry. In particular embodiments, p-doped p-body (PBODY) region 114 may be formed either before formation of FOX 116 and the active area, or after formation of gate 102 (e.g., polysilicon).

A p-type substrate 124 can support an n-type buried layer (NBL) 122, on which an n-type epitaxial (N-EPI) layer 126 can be grown. In N-EPI 126, PBODY 114 can be formed, and p+ region 106, as well as n+ region 110 can be formed therein. Also, a p-type ohmic contact from the p-body region to the source electrode (e.g., metal) can be made as shown via regions 106 and 110. Further, PBODY 114 can extend laterally from n+ region 110 by a distance of Lgb. Such a distance (Lgb) can range from about 0.1 µm to about 1.0 µm, including from about 0.2 µm to about 0.8 µm, and more specifically about 0.6 µm. NWELL 118 can extend laterally from the drain oxide (e.g., FOX region 116 partially under gate 102) by a distance of Lgd. Such a distance (Lgd) can range from about 0 µm to about 1.0 µm, including from about 0.2 µm to about 0.8 µm, and more specifically about 0.5 µm.

Figure 2:
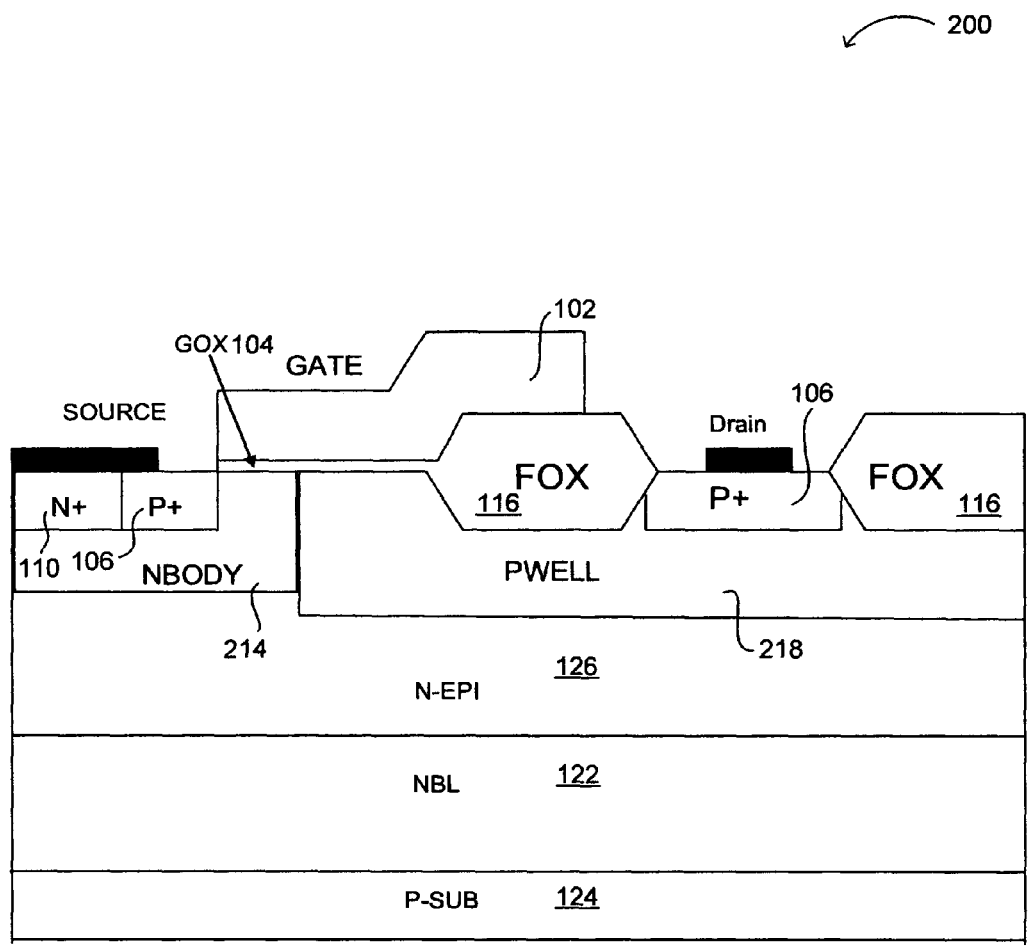
FIG. 2 is a cross-section diagram of an example p-type LDMOS transistor.

Referring now to FIG. 2, shown is a cross-section diagram 200 of an example p-type LDMOS (P-LDMOS) transistor. In this example, the drain region of the P-LDMOS can be formed by PWELL 218 that may also be a well of an NMOS transistor. In particular embodiments, n-doped n-body (NBODY) region 214 may be formed either before formation of FOX 116 and the active area, or after formation of gate 102 (e.g., polysilicon).

First Exemplary Method of Making an LDMOS Transistor

An exemplary method of fabricating an LDMOS transistor with a source region, a drain region, and a gate region on a substrate, can include: (i) implanting p-type dopants into a surface of the substrate to form a p-type buried layer (PBL) region, and implanting n-type dopants into the surface of the substrate to form an n-type buried layer (NBL) region, the NBL region and the PBL region being adjacent to each other, or having a spacing; (ii) growing an n-type epitaxial (N-EPI) layer on the NBL and PBL regions; (iii) implanting p-type dopants into the surface of the substrate to form a p-doped deep p-well (DPW) region on the PBL region; (iv) forming a well region in the N-EPI layer; (v) implanting dopants into the source region to form a doped body region; (vi) after the doped body region formation, forming an active area and a field oxide (FOX) region for isolation of the LDMOS transistor, and forming a drain oxide between the source region and the drain region of the LDMOS transistor; (vii) after the doped body region formation, forming a gate oxide adjacent to the source and drain regions, and forming a gate by covering the gate oxide and a portion of the drain oxide with a conductive material; and (viii) implanting dopants into the drain and source regions to form a doped drain region, and first and second doped source regions.

Figure 3:
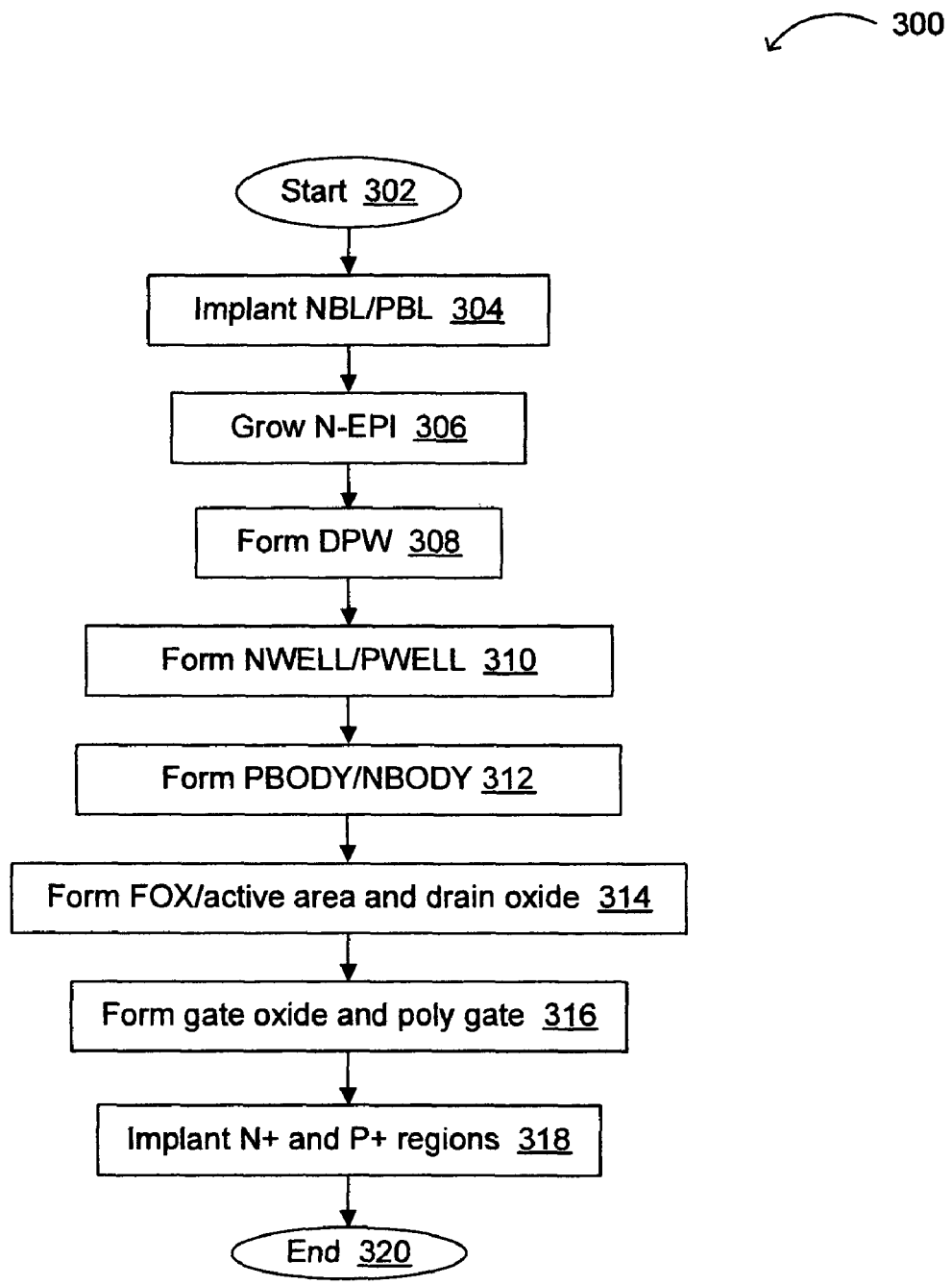
FIG. 3 is a flow diagram of a first example method of making an LDMOS transistor in accordance with embodiments of the present invention.

Referring now to FIG. 3, shown is a flow diagram 300 of a first example method of making an LDMOS transistor in accordance with embodiments of the present invention. In this particular example, NWELL/PWELL or PBODY/NBODY formation occurs before the formation of FOX, active area, and GOX. This approach allows for independent optimization of NWELL/PWELL or PBODY/NBODY regions without affecting those CMOS process steps, such as CMOS threshold implantation adjustments, that are implemented between the formation of FOX and active area, and the formation of gate oxide and poly gate.

The flow can begin (302), and p-type dopants can be implanted into a substrate to form a PBL region, and n-type dopants can be implanted to form an NBL region (304). An N-EPI layer can then be grown on the NBL and PBL regions (306). P-type dopants can be implanted into the substrate to form a DPW region on the PBL region (308). A well region (e.g., NWELL/PWELL) can be formed in the N-EPI layer (310). In 312, dopants can then be implanted into the source region to form a doped body region (e.g., PBODY/NBODY). After the doped body region formation, an active area and a FOX region for isolation of the LDMOS transistor, and a drain oxide between the source region and the drain region of the LDMOS transistor, can be formed (314). Also after the doped body region formation, a gate oxide adjacent to the source and drain regions, and a gate can be formed (316). The gate can be formed by covering the gate oxide and a portion of the drain oxide with polysilicon. Dopants can then be implanted into the drain and source regions to form a doped drain region, and first and second doped source regions (318), thus completing the flow (320).

In this fashion, an NBL, a PBL, and an N-EPI layer can be added to a beginning of a BCD-based process flow. In addition, a deep PWELL (DPW) can be added into the process flow for isolation of the N-EPI pocket, which can be used for active devices (e.g., N-LDMOS, P-LDMOS, CMOS, bipolar transistors, etc.). Further, unless an ordering is stated, the ordering of process flow steps as described herein can be suitably altered in particular embodiments. For example, formation of source and drain n+/p+ regions can be reversed, or otherwise altered. Further, a similar process flow can be used to form p-type or n-type LDMOS transistors, with appropriate doping variations.

Figure 4G:
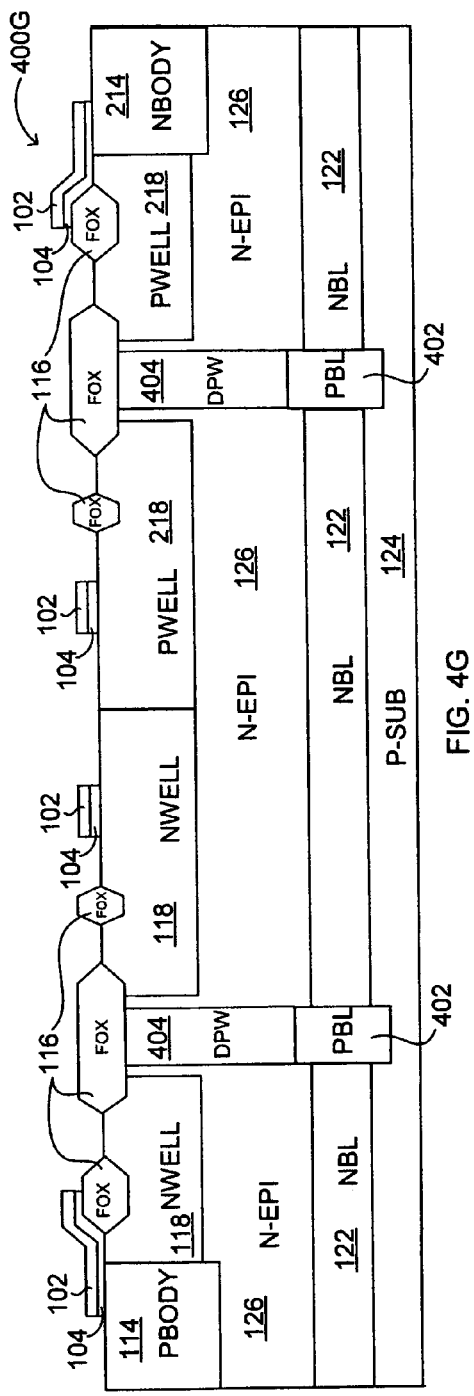

FIGS. 4A-4H are cross-section diagrams showing an example process flow for making a LDMOS transistor per the first example method of FIG. 3, in accordance with embodiments of the present invention. On this example process flow, the drain oxide region and FOX region are formed using a same oxidation process. However, the drain oxide region and FOX region may also be formed using different local oxidation of silicon (LOCOS) process, in particular embodiments. In FIG. 4A (400A), buried layers NBL 122 and PBL 402 can be formed via implantation in the substrate 124. In FIG. 4B (400B), N-EPI 126 can be grown to cover buried layers NBL 122 and PBL 402. In FIG. 4C (400C), deep p-type well (DPW) 404 can be formed on PBL 402 to provide device isolation.

Figure 4H:
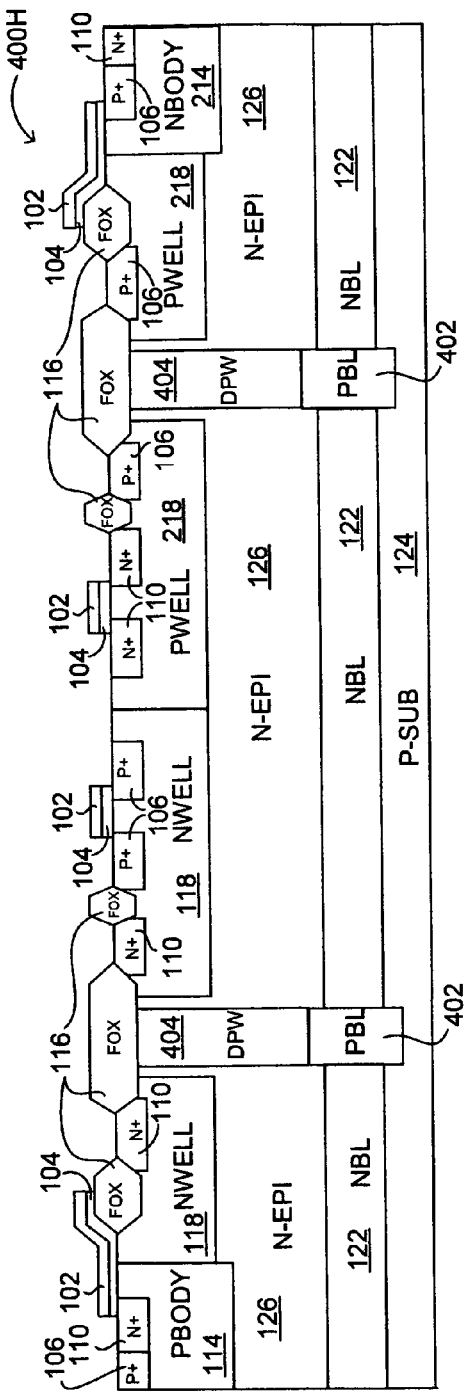

In FIG. 4D (400D), NWELL 118 and PWELL 218 regions can be formed. In FIG. 4E (400E), PBODY 114 and NBODY 214 regions can be formed. In FIG. 4F (400F), FOX 116 regions can be formed. In FIG. 4G (400G), gate oxide 104 and gate 102 regions can be formed by etching deposited polysilicon on grown gate oxide. In FIG. 4H (400H), n+ region 110 implantation can be performed by implanting n-type dopants, and p+ region 106 implantation can be performed by implanting p-type dopants.

For example, n+ regions 110 can be formed as shown in n-type drain regions and PBODY 114 regions for N-LDMOS devices, as well as for source/drain formation and well contacting for CMOS devices. Similarly, p+ regions 106 can be formed as shown in p-type drain regions and NBODY 214 regions for P-LDMOS devices, as well as for source/drain formation and well contacting for CMOS devices. In addition, while particular process steps or sequences have been shown for formation of LDMOS and CMOS devices, such process modules may be embedded with other process modules. In such cases, there can be additional or other processing steps in the process sequence flows described herein.

In the particular example flow shown in FIGS. 4A-4H, the CMOS portion is built on NWELL/PWELL structures. However, such CMOS portions may also be built on NBODY/PBODY regions, instead of NWELL/PWELL. Furthermore, an order of NWELL/PWELL formation and PBODY/NBODY formation may be switched, depending on a thermal cycle budge, or other side effect, associated with the NWELL/PWELL or PBODY/NBODY formation.

Also, in this first exemplary method of making an LDMOS transistor, another conventional CMOS process having retrograde wells (e.g., after the formation of FOX and active region) that are different from the NWELL/PWELL or NBODY/PBODY of an LDMOS transistor, can also be included. Since the NWELL/PWELL and NBODY/PBODY may be formed before the FOX and active regions, their thermal cycle optimization may have little or no impact on the retrograde CMOS well formed after FOX and active region formation. In addition, particular embodiments may also fabricate N-LDMOS or P-LDMOS transistors according to the first exemplary method of making an LDMOS transistor as described herein, or any other suitable method, while other P-LDMOS or N-LDMOS transistors may be fabricated using another suitable approach. Further, particular embodiments may also share an NWELL of an N-LDMOS transistor with the NBODY of a PLDMOS transistor, or a PWELL of a PLDMOS transistor with the PBODY of an NLDMOS transistor, as well as any other suitable combinations.

Exemplary LDMOS Transistor Structure

In one example, an LDMOS transistor having a source region, a drain region, and a gate region on a substrate, can include: (i) a PBL region and an NBL region adjacent to each other on a substrate; (ii) an N-EPI layer on the NBL and PBL regions; (iii) a DPW region on the PBL region; (iv) a well region in the N-EPI layer; (v) a FOX region for isolation of the LDMOS transistor; (vi) a drain oxide between the source region and the drain region of the LDMOS transistor; (vii) a gate oxide adjacent to the source and drain regions; (viii) a conductive gate over the gate oxide and a portion of the drain oxide; (ix) a doped body region in the source region, where the doped body region partially overlaps with the well region; (x) a doped drain region in the drain region; and (xi) a first doped source region and a second doped source region adjacent to each other in the source region of the doped body region.

Figure 5:
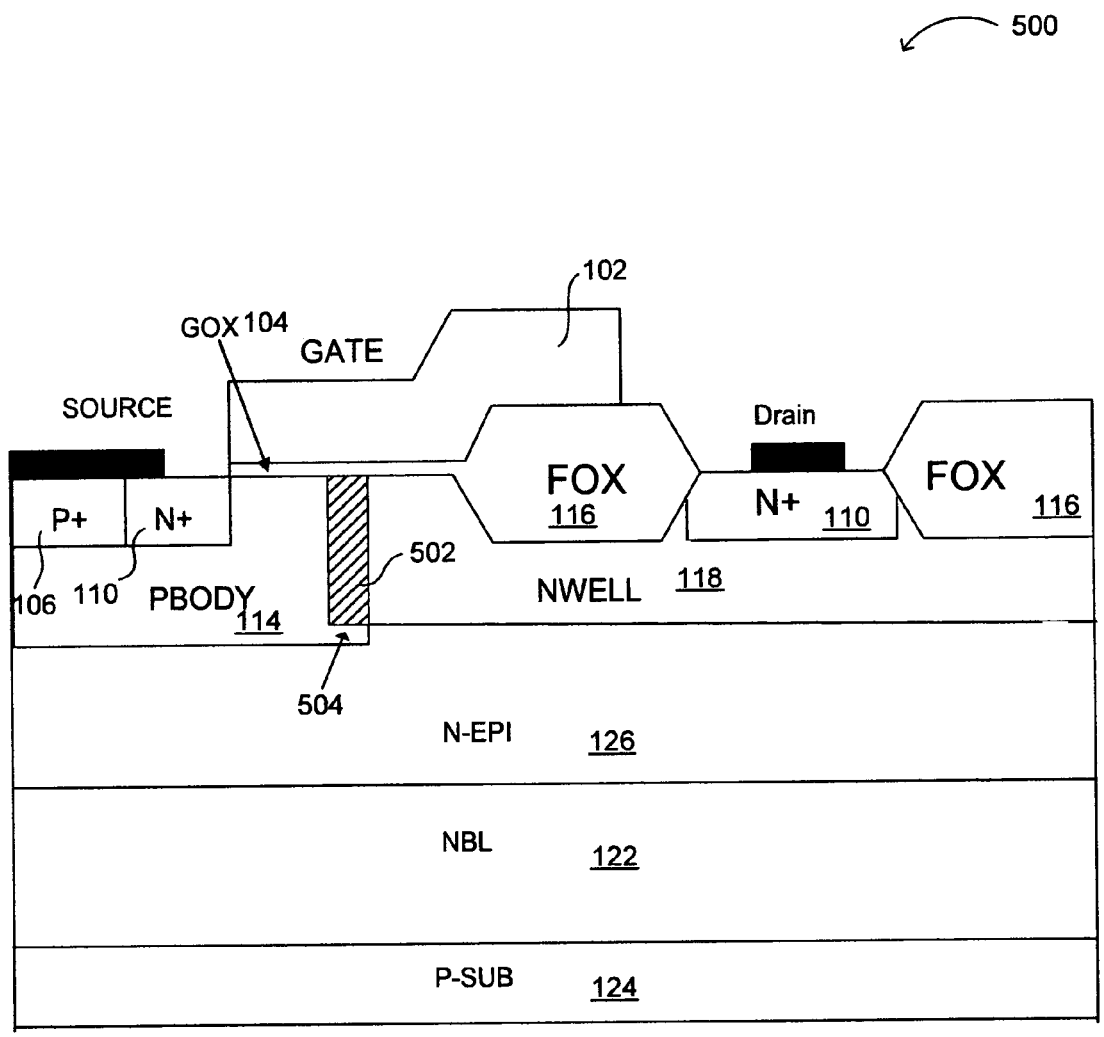
FIG. 5 is a cross-section diagram of an example LDMOS transistor structure made using the first example method of FIG. 3, in accordance with embodiments of the present invention.

Referring now to FIG. 5, shown is a cross-section diagram 500 of an example LDMOS transistor structure made using the first example method of FIG. 3, in accordance with embodiments of the present invention. For example, the structure of FIG. 5 can be formed using the process steps shown above with reference to FIGS. 4A-4H, or suitable variations thereof. This particular example is similar to that of FIG. 1, except with PBODY 114 and NWELL 118 overlapping to form overlap region 502. The overlapping of the PBODY 114 and NWELL 118 can create a "P shield" region 504 that extends underneath the NWELL 118 region under GOX 104. The P shield region 504 can prevent NWELL region 118 under GOX 104 from seeing a relatively high electrical field, and provide RESURF (reduced surface field) effect protection for better $R_{dson}$ versus breakdown voltage (BV) tradeoffs for that region.

Second Exemplary Method of Making an LDMOS Transistor

An exemplary method of fabricating an LDMOS transistor with a source region, a drain region, and a gate region on a substrate, can include: (i) implanting p-type dopants into a surface of the substrate to form a PBL region, and implanting n-type dopants into the surface of the substrate to form an NBL region, the NBL region and the PBL region being adjacent to each other, or having a spacing; (ii) growing an N-EPI layer on the NBL and PBL regions; (iii) implanting p-type dopants into the surface of the substrate to form a DPW region on the PBL region; (iv) forming a well region in the N-EPI layer; (v) forming an active area and a FOX region for isolation of the LDMOS transistor, and forming a drain oxide between the source region and the drain region of the LDMOS transistor; (vi) forming a gate oxide adjacent to the source and drain regions, and forming a gate by covering the gate oxide and a portion of the drain oxide with a conductive material; (vii) after the FOX, the active area, and the gate oxide formation, implanting dopants into the source region to form a doped body region; and (viii) implanting dopants into the drain and source regions to form a doped drain region, and first and second doped source regions.

Figure 6:
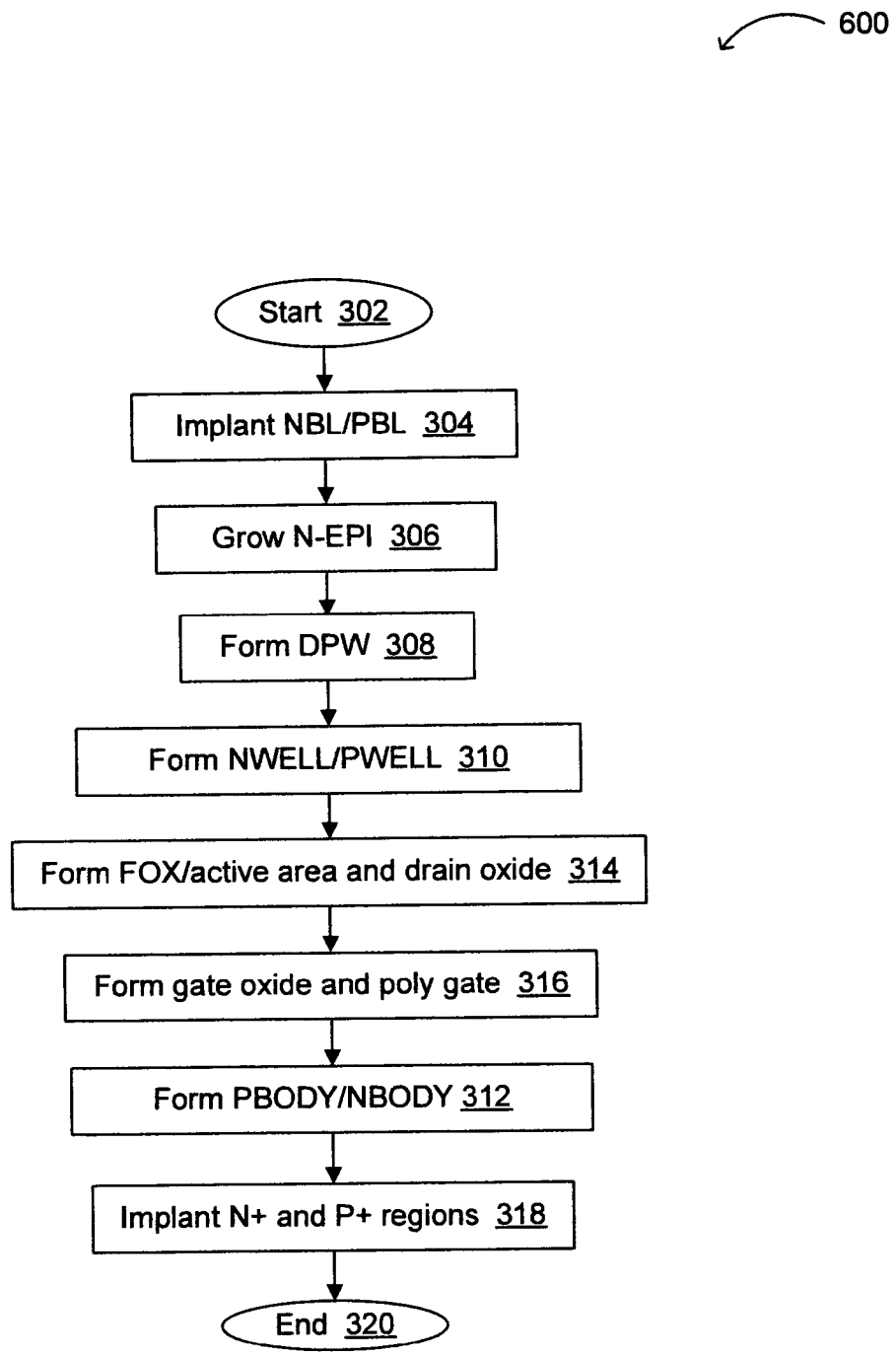
FIG. 6 is a flow diagram of a second example method of making an LDMOS transistor in accordance with embodiments of the present invention.

Referring now to FIG. 6, shown is a flow diagram 600 of a second example method of making an LDMOS transistor in accordance with embodiments of the present invention. In this particular example, PBODY/NBODY formation can occur after the formation of FOX, active area, and GOX. Since some CMOS process steps occur before formation of gate oxide and poly gate, the PBODY/NBODY in this particular second exemplary method of making an LDMOS transistor can be formed through, e.g., a high-energy chain implantation with a large tiled angle without employing a thermal drive-in to avoid interruption of the CMOS process steps. This approach also allows for self alignment of implant regions with respect to the gate.

The flow can begin (302), and p-type dopants can be implanted into a substrate to form a PBL region, and n-type dopants can be implanted to form an NBL region (304). An N-EPI layer can then be grown on the NBL and PBL regions (306). P-type dopants can be implanted into the substrate to form a DPW region on the PBL region (308). A well region (e.g., NWELL/PWELL) can be formed in the N-EPI layer (310). An active area and a FOX region for isolation of the LDMOS transistor, and a drain oxide between the source region and the drain region of the LDMOS transistor, can be formed (314). A gate oxide adjacent to the source and drain regions, and a gate, can be formed (316). After the formation of FOX, active area, and gate in steps 314 and 316, step 312 can be performed in which dopants are implanted into the source region to form a doped body region (e.g., PBODY/NBODY). Dopants can then be implanted into the drain and source regions to form a doped drain region, and first and second doped source regions (318), thus completing the flow (320).

FIGS. 7A-7D are cross-section diagrams showing an example process flow for making a LDMOS transistor per the second example method of FIG. 6, in accordance with embodiments of the present invention. The example below can correspond to that discussed above with reference to FIGS. 4A-4D, where the process flow illustrated in FIGS. 7A-7D follow the cross-sectional diagram of FIG. 4D. In this particular example process flow, the drain oxide and FOX regions are formed using a same oxidation process. However, the drain oxide and FOX regions may also be formed using different local oxidation of silicon (LOCOS) processes in particular embodiments.

Figure 7A:
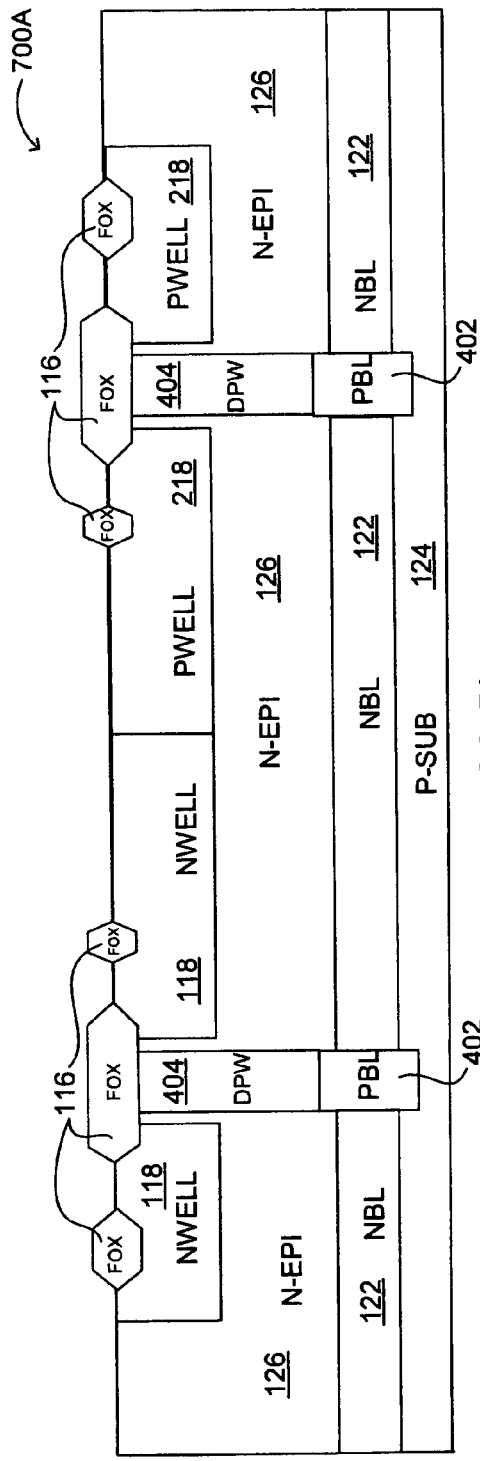
Figure 7B:
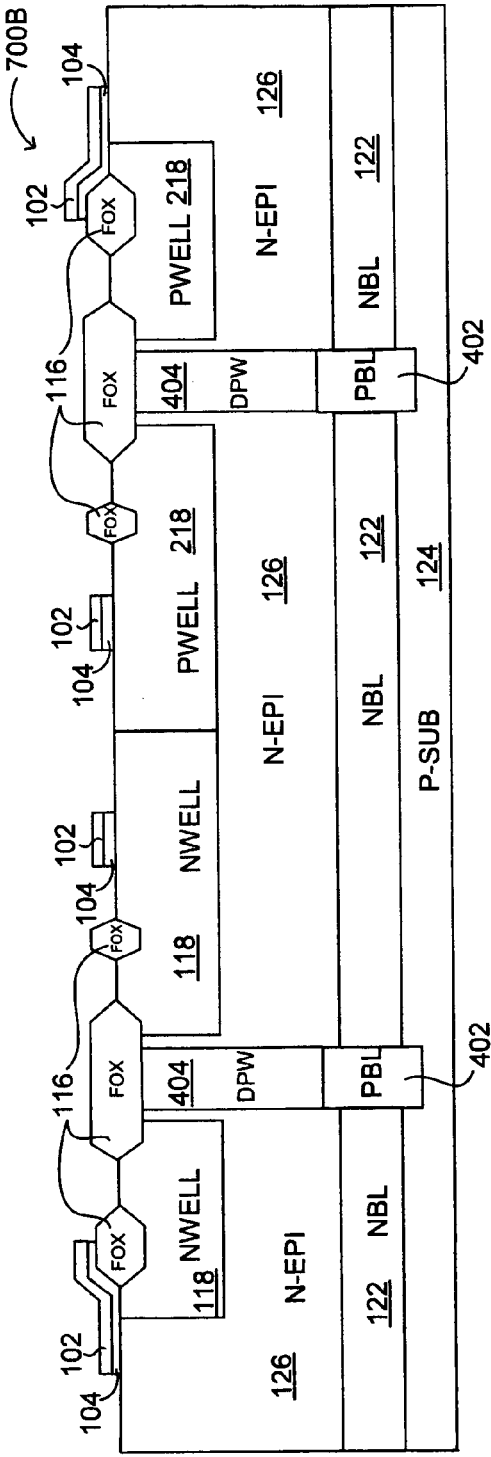

In FIG. 7A (700A), FOX 116 regions can be formed. In FIG. 7B (700B), gate oxide 104 and gate 102 regions can be formed by etching deposited polysilicon on grown gate oxide. In FIG. 7C (700C), PBODY 114 and NBODY 214 regions can be formed. In FIG. 7D (700D), implantation of n+ region 110 can be performed by implanting n-type dopants, and implantation of p+ region 106 can be performed by implanting p-type dopants. For example, n+ regions 110 can be formed as shown in n-type drain regions and PBODY 114 regions for N-LDMOS devices, as well as for source/drain formation and well contacting for CMOS devices. Similarly, p+ regions 106 can be formed as shown in p-type drain regions and NBODY 214 regions for P-LDMOS devices, as well as for source/drain formation and well contacting for CMOS devices.

Also, in this second exemplary method of making an LDMOS transistor, another CMOS process portion having its own retrograde wells (e.g., after the formation of FOX and active region) that are different than the NWELL/PWELL of LDMOS transistors, can be accommodated in particular embodiments. Since the NWELL/PWELL can be formed before the FOX and active regions, their thermal cycle optimization has little or no impact on the retrograde CMOS well formed after FOX and active regions. In addition, one type of N-LDMOS or P-LDMOS may be fabricated according to the second exemplary method of making an LDMOS transistor as described herein, or any other suitable method, while another type of P-LDMOS or N-LDMOS may be fabricated using the first exemplary method of making an LDMOS transistor as described herein, or any other suitable approach.

Exemplary LDMOS Transistor Structures and Applications

Figure 8A:
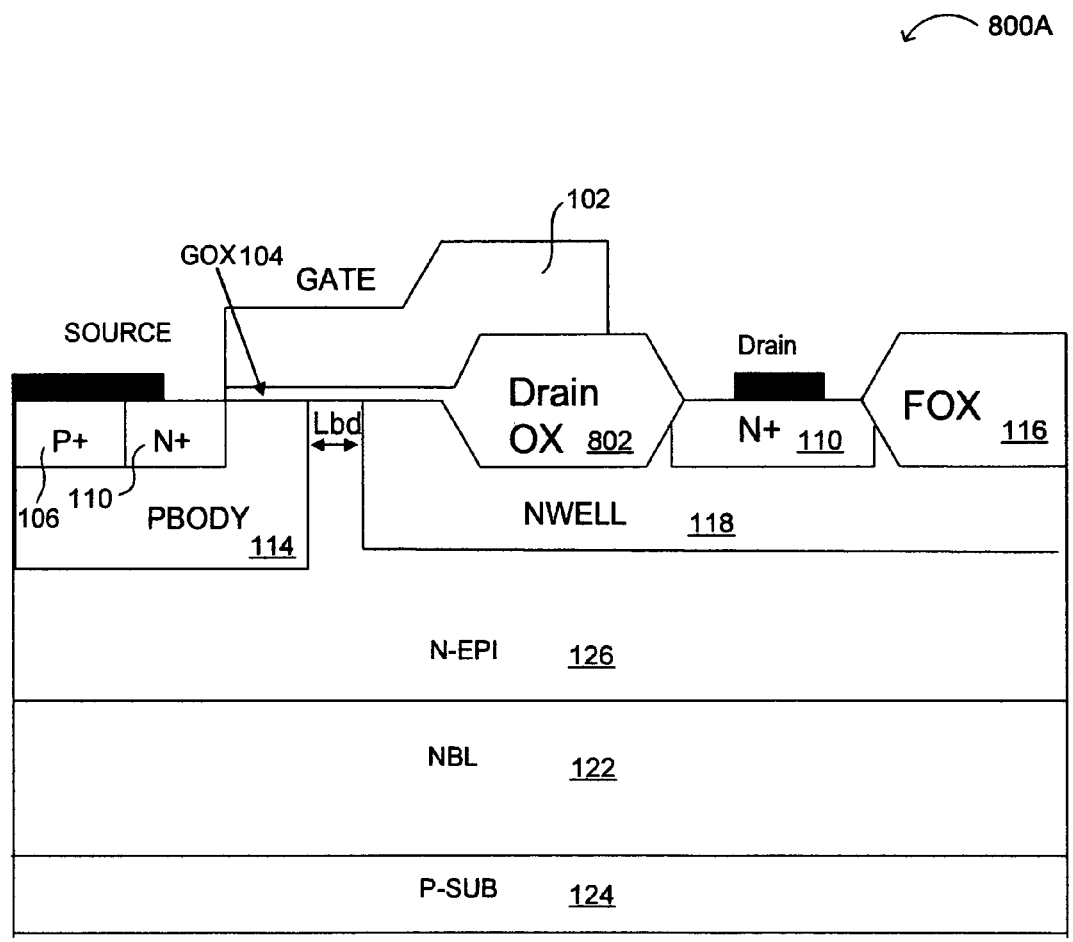
FIG. 8A is a cross-section diagram of an example LDMOS transistor structure formed using methods in accordance with embodiments of the present invention.

Referring now to FIG. 8A, shown is a cross-section diagram 800A of an example LDMOS transistor structure formed using methods in accordance with embodiments of the present invention. In this particular example transistor structure, a transistor gate (e.g., 102) at least partially covers a regular gate oxide (e.g., 104) plus drain oxide 802. Thus, a drain oxide may be implemented as FOX 116 (as shown in FIGS. 1 and 2), or the drain oxide 802 can be formed through a separate local oxidation of silicon (LOCOS) process. While a thickness of FOX 116, such as for isolation of the transistor, may be about 4000 Å, the drain oxide may be about 1000 Å. Further, drain oxide 802 may be grown (e.g., using LOCOS) such that other regions are not substantially affected. This is because LOCOS is selectively defined, as opposed to where oxide is uniformly grown and then partially etched away based on a mask pattern. In addition, a FOX 116 region may also be a first LOCOS, where the LOCOS under the gate (drain oxide 802) can be a second LOCOS process (or vice versa in the order of formation). In this fashion, a special selectivity of drain oxide 802 can be obtained for thickness control of the drain oxide.

Also, particular embodiments can be utilized to develop such drain oxides 802 of any suitable thickness. For example, drain oxide thicknesses of from about 50 Å to about 2000 Å, including from about 250 Å to about 1500 Å, and more precisely about 1000 Å, can be supported. In addition, such a second LOCOS approach for drain oxide 802 formation can also eliminate any sharp step transitions between various oxides under transistor gates. This is because the bird beak region resulting from the second LOCOS process provides a substantially smooth transition between GOX 104 and drain oxide 802 regions. Generally, formation of LOCOS drain oxides includes: (i) formation of a protection layer (e.g., pad oxide and silicon nitride); (ii) photolithography for definition of the drain oxide region; (iii) thick oxidation; and (iv) formation of the LOCOS drain oxide. There may also be other implantation steps prior to the FOX LOCOS, between the FOX LOCOS and a second HV drain oxide LOCOS, and/or between the second LOCOS and gate oxide formation, etc.

Figure 8B:
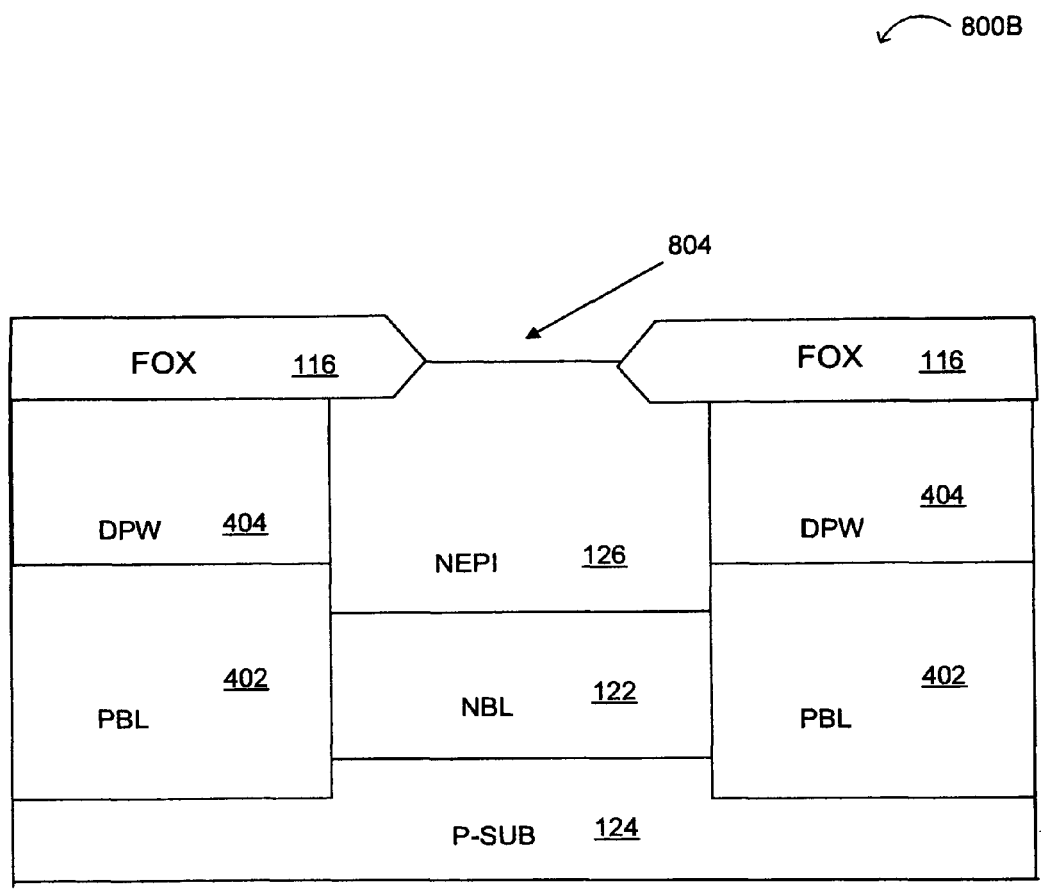
FIG. 8B is a cross-section diagram of an example pocket isolation structure formed using methods in accordance with embodiments of the present invention.

Referring now to FIG. 8B, shown is a cross-section diagram 800B of an example pocket isolation structure formed using methods in accordance with embodiments of the present invention. Here, FOX regions 116 over DPW regions 404 on PBL regions 402 can provide pocket isolation of N-EPI 126 over NBL 122 as shown. Pocket isolation 804 can provide active regions for N-LDMOS, P-LDMOS, CMOS, or other devices.

Figure 9:
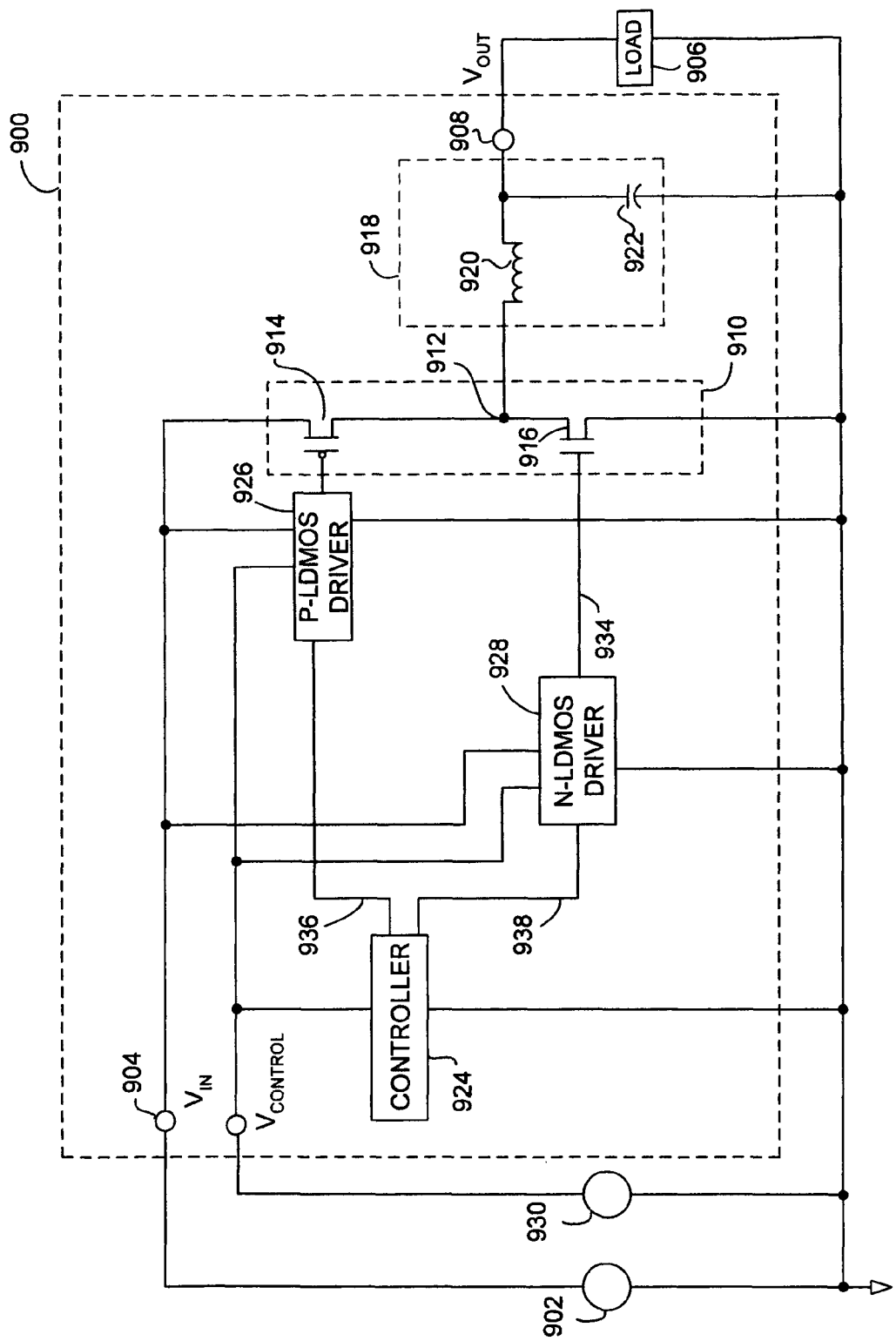
FIG. 9 is a block schematic diagram of an example switching voltage regulator application of LDMOS transistors suitable for use in accordance with embodiments of the present invention.

Referring now to FIG. 9, shown is a block schematic diagram 900 of an example switching voltage regulator application of LDMOS transistors suitable for use in accordance with embodiments of the present invention. Exemplary switching regulator 900 may be coupled to a first high DC input voltage source 902 (e.g., a battery) by an input terminal 904. The switching regulator 900 may also be coupled to a load 906 (e.g., an IC) by an output terminal 908. The switching regulator 900 thus serves as a DC-to-DC converter between the input terminal 904 and the output terminal 908.

The switching regulator 900 can include a switching circuit 910 that serves as a power switch for alternately coupling and decoupling the input terminal 904 to an intermediate terminal 912. Switching circuit 910 may also include a rectifier, such as a switch or diode, coupling the intermediate terminal 912 to ground. For example, switching circuit 910 may include a first transistor 914 having a source connected to the input terminal 904, and a drain connected to the intermediate terminal 912, and a second transistor 916 having a source connected to ground and a drain connected to the intermediate terminal 912. The first transistor 914 may be a p-type LDMOS transistor, whereas the second transistor 916 may be an n-type LDMOS transistor.

The intermediate terminal 912 may be coupled to the output terminal 908 by an output filter 918. The output filter 918 converts the rectangular waveform of the intermediate voltage at the intermediate terminal 912 into a substantially DC output voltage at the output terminal 908. In an example buck-converter topology, output filter 918 includes an inductor 920 connected between intermediate terminal 912 and the output terminal 908, and a capacitor 922 connected in parallel with the load 906. During a p-type LDMOS conduction period, the first transistor is closed, and the voltage source 902 supplies energy to the load 906 and the inductor 920 through the first transistor 914. However, during an LDMOS transistor conduction period, the second transistor 916 is closed, and current flows through the second transistor 916 as energy is supplied by the inductor 920. The resulting output voltage $V_{out}$ may thus be a substantially DC voltage.

The switching regulator may also include a controller 924, a p-type LDMOS driver 926, and an n-type LDMOS driver 928 for controlling the operation of the switching circuit 700. The p-type LDMOS driver 926 and the n-type LDMOS driver are coupled to voltage source 930. A first control line 932 can connect the p-type LDMOS transistor 914 to its driver 926, and a second control line 934 can connect the n-type LDMOS transistor 916 to its driver 928. The two drivers may be connected to the controller 924 by control lines 936 and 938, as shown. The controller 924 causes the switching circuit 900 to alternate between p-type LDMOS and n-type LDMOS conduction periods so as to generate an intermediate voltage $V_{int}$ at intermediate terminal 912 that has a rectangular waveform. Controller 924 can also include a feedback circuit for measuring the output voltage and the current passing through the output terminal.

Although the controller 924 is typically a pulse width modulator, particular embodiments are also applicable to other modulation schemes, such as pulse frequency modulation. Further, while the switching regulator discussed above has a buck converter topology, particular embodiments are also applicable to other voltage regulator topologies, such as a boost converter or a buck-boost converter, and to radio frequency (RF) output amplifiers. In another application example, an n-type LDMOS, which is also known as high-side switch, can be used to replace p-type LDMOS transistor 914. In this example configuration, the n-type high-side switch may have its drain connected to input terminal 904, and its source connected to intermediate terminal 912. The p-type LDMOS driver 926 may also be replaced with a high-side n-type LDMOS driver in this particular example.

While the above examples include processing and structural implementations of LDMOS transistors, one skilled in the art will recognize that other technologies and/or structures in accordance with embodiments. Further, one skilled in the art will recognize that other device cross-section arrangements and the like may also be used in accordance with embodiments. For example, and as shown above, P-LDMOS devices as well as N-LDMOS devices can be formed. Further, spacing between n+ drain regions and the gate, as well as between doped body and well regions, can be changed in particular embodiments. In addition, nitride or a high-K dielectric material can be used in place of the drain oxide in particular embodiments.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of fabricating a lateral double-diffused metal oxide semiconductor (LDMOS) transistor having a source region, a drain region, and a gate region on a substrate, the method comprising:
   a) implanting p-type dopants into a surface of said substrate to form a p-type buried layer (PBL) region, and implanting n-type dopants into said surface of said substrate to form an n-type buried layer (NBL) region;
   b) growing an n-type epitaxial (N-EPI) layer on said NBL and PBL regions;
   c) implanting p-type dopants into said surface of said substrate to form a p-doped deep p-well (DPW) region on said PBL region;
   d) forming a well region in said N-EPI layer;
   e) implanting dopants into said source region to form a doped body region;
   f) after said doped body region formation, forming an active area and a field oxide (FOX) region for isolation of said LDMOS transistor, said FOX region covering said DPW region, and forming a drain oxide between said source region and said drain region of said LDMOS transistor;
   g) after said doped body region formation, forming a gate oxide adjacent to said source and drain regions, and forming a gate by covering said gate oxide and a portion of said drain oxide with a conductive material; and
   h) implanting dopants into said drain and source regions to form a doped drain region, and first and second doped source regions.

2. The method of claim 1, wherein said FOX region is formed using a first local oxidation of silicon (LOCOS) process, and said drain oxide is formed using a second LOCOS process.

3. The method of claim 1, wherein said drain oxide and said FOX region are formed using a same oxidation process.

4. The method of claim 1, wherein:
   a) said well region comprises an n-type well (NWELL);
   b) said doped body region comprises a p-doped p-body (PBODY) region;
   c) said doped drain region and said first doped source region each comprise an n-doped n+ region; and
   d) said second doped source region comprises a p-doped p+ region.

5. The method of claim 4, wherein said PBODY region and said NWELL are separated by a predetermined distance under said gate.

6. The method of claim 4, wherein said PBODY region and said NWELL partially overlap under said gate.

7. The method of claim 1, wherein:
   a) said well region comprises a p-type well (PWELL);
   b) said doped body region comprises an n-doped n-body (NBODY) region;
   c) said doped drain region and said first doped source region each comprise a p-doped p+ region; and
   d) said second doped source region comprises an n-doped n+ region.

8. The method of claim 7, wherein said NBODY region and said PWELL are separated by a predetermined distance under said gate.

9. The method of claim 7, wherein said NBODY region and said PWELL partially overlap under said gate.

10. The method of claim 1, wherein said DPW is deeper than said doped body region.

11. The method of claim 1, wherein said implanting dopants to form said doped body region occurs after said well region formation.

12. The method of claim 1, further comprising sharing said well region with a complementary metal oxide semiconductor (CMOS) structure.

13. The method of claim 1, wherein only two doped regions are formed in said source region as said first and second doped source regions.

14. The method of claim 13, wherein said first and second doped source regions are of opposite polarity.

15. The method of claim 1, wherein said implanting dopants to form said doped body region occurs before said well region formation.

16. The method of claim 1, wherein said active area is defined by said FOX region.

17. The method of claim 1, further comprising forming a retrograde CMOS well after said formation of said active area and said FOX region.

18. The method of claim 1, wherein said doped body region is shared with a same polarity well region of another LDMOS transistor.

19. The method of claim 6, further comprising forming a shield region in said PBODY region below said partial overlap of said PBODY region with said NWELL.

20. The method of claim 9, further comprising forming a shield region in said NBODY region below said partial overlap of said NBODY region with said PWELL.

* * * * *